US012727228B2

(12) United States Patent
Tzou et al.

(10) Patent No.: US 12,727,228 B2
(45) Date of Patent: Sep. 1, 2026

(54) HIGH ELECTRON MOBILITY TRANSISTOR AND FABRICATION METHOD THEREOF

(71) Applicant: Vanguard International Semiconductor Corporation, Hsinchu (TW)

(72) Inventors: Chen-Dong Tzou, Taipei City (TW); Wei-Chih Cheng, Tainan City (TW); Chia-Hao Lee, Hsinchu County (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 433 days.

(21) Appl. No.: 18/226,764

(22) Filed: Jul. 26, 2023

(65) Prior Publication Data

US 2025/0040220 A1 Jan. 30, 2025

(51) Int. Cl.

*H10D 30/47* (2025.01)
*H10D 30/01* (2025.01)
*H10D 62/85* (2025.01)
*H10D 64/00* (2025.01)
*H10D 64/01* (2025.01)

(52) U.S. Cl.

CPC ......... *H10D 64/112* (2025.01); *H10D 30/015* (2025.01); *H10D 30/475* (2025.01); *H10D 62/8503* (2025.01); *H10D 64/01* (2025.01)

(58) Field of Classification Search

CPC .. H10D 30/015; H10D 30/471; H10D 30/472; H10D 30/473; H10D 30/4732; H10D 30/4735; H10D 30/4738; H10D 30/474; H10D 30/475; H10D 30/4755; H10D 30/476; H10D 30/477; H10D 30/478; H10D 62/824; H10D 62/8503; H10D 64/112; H10D 64/602

See application file for complete search history.

(56) References Cited

U.S. PATENT DOCUMENTS

2011/0127604 A1 6/2011 Sato
2014/0209922 A1* 7/2014 Ota ...................... H10D 64/111 257/194
2017/0229567 A1 8/2017 Morvan
2019/0157440 A1 5/2019 Green
(Continued)

FOREIGN PATENT DOCUMENTS

| TW | 201933490 A | 8/2019 |
|---|---|---|
| TW | 202002289 A | 1/2020 |
| TW | 202230799 A | 8/2022 |

*Primary Examiner* — Eric A. Ward
(74) *Attorney, Agent, or Firm* — Winston Hsu

(57) ABSTRACT

A high electron mobility transistor includes a semiconductor channel layer and a semiconductor barrier layer disposed on a substrate in sequence. A source electrode and a drain electrode are disposed on the semiconductor channel layer. A semiconductor cap layer is disposed on the semiconductor barrier layer. A first dielectric layer is disposed over the source electrode, the semiconductor cap layer and the drain electrode. A first via passes through the first dielectric layer and is extended downward onto the semiconductor cap layer. A gate electrode is disposed on the first dielectric layer and in contact with the first via. A first field plate is disposed in the first dielectric layer. A second field plate is disposed on the first dielectric layer and in contact with the first field plate.

12 Claims, 10 Drawing Sheets

(56) References Cited

U.S. PATENT DOCUMENTS

2020/0365718 A1* 11/2020 Lee ...................... H10D 30/475
2021/0265477 A1 8/2021 Lu
2022/0393024 A1* 12/2022 Hao ..................... H10D 30/015
2023/0080636 A1* 3/2023 Macelwee ............ H10D 62/343
257/194
2024/0063219 A1* 2/2024 Sharma .................. H10D 84/05

* cited by examiner 110
160
127
105
103
101
154
S109
151
122
113
152
109
125P
153
125
161
133
S111
111
131
132

HIGH ELECTRON MOBILITY TRANSISTOR AND FABRICATION METHOD THEREOF

BACKGROUND OF THE INVENTION

1. Field of the Invention

The present disclosure relates generally to semiconductor devices, and more particularly to high electron mobility transistors and fabrication methods thereof.

2. Description of the Prior Art

In semiconductor technology, group III-V compound semiconductors may be used to construct various integrated circuit (IC) devices, such as high-power field-effect transistors (FETs), high-frequency transistors, or high electron mobility transistors (HEMTs). A HEMT is a field effect transistor having a two-dimensional electron gas (2DEG) layer close to a junction between two materials with different energy gaps (i.e., a hetero-junction). The 2DEG layer is used as the transistor channel instead of a doped region, as is generally the case for metal oxide semiconductor field effect transistors (MOSFETs). Compared with MOSFETs, HEMTs have a number of attractive properties, such as high electron mobility and the ability to transmit signals at high frequencies. In the conventional HEMTs, a field plate may be provided to regulate the electric field distribution for increasing the breakdown voltage. However, the process steps of forming the field plate of the conventional HEMTs are complicated and the manufacturing cost is increased.

SUMMARY OF THE INVENTION

In view of this, the present disclosure provides high electron mobility transistors (HEMTs) and fabrication methods thereof. Compared with the conventional HEMTs, fewer photo-masks and fewer metal layers are used to form more field plates for the HEMTs, thereby simplifying the process steps and reducing the cost of fabricating the HEMTs. Moreover, the more field plates achieve the effect of redistributing the electric field, thereby increasing the breakdown voltage of the HEMTs.

According to an embodiment of the present disclosure, a high electron mobility transistor is provided and includes a substrate, a semiconductor channel layer, a semiconductor barrier layer, a source electrode, a drain electrode, a semiconductor cap layer, a first dielectric layer, a first via, a gate electrode, a first field plate and a second field plate. The semiconductor channel layer and the semiconductor barrier layer are disposed on the substrate in sequence. The source electrode and the drain electrode are disposed on the semiconductor channel layer. The semiconductor cap layer is disposed on the semiconductor barrier layer. The first dielectric layer is disposed over the source electrode, the semiconductor cap layer and the drain electrode. The first via is disposed to pass through the first dielectric layer, and extended downward onto the semiconductor cap layer. The gate electrode is disposed on the first dielectric layer and in direct contact with the first via. The first field plate is disposed in the first dielectric layer. In addition, the second field plate is disposed on the first dielectric layer and in direct contact with the first field plate.

According to an embodiment of the present disclosure, a method of fabricating a high electron mobility transistor is provided and includes the following steps. A substrate is provided, and a semiconductor channel layer and a semiconductor barrier layer are formed on the substrate in sequence. A semiconductor cap layer is formed on the semiconductor barrier layer. A source electrode and a drain electrode are formed on the semiconductor channel layer. A first dielectric layer is formed over the source electrode, the semiconductor cap layer and the drain electrode. A first opening is formed in the first dielectric layer. A second opening is formed to pass through the first dielectric layer and be extended downward onto the semiconductor cap layer. A first metal layer is deposited on the first dielectric layer and fills up the first opening and the second opening to respectively form a first field plate in the first opening and a first via in the second opening. In addition, the first metal layer is patterned to form a gate electrode in contact with the first via and a second field plate in contact with the first field plate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
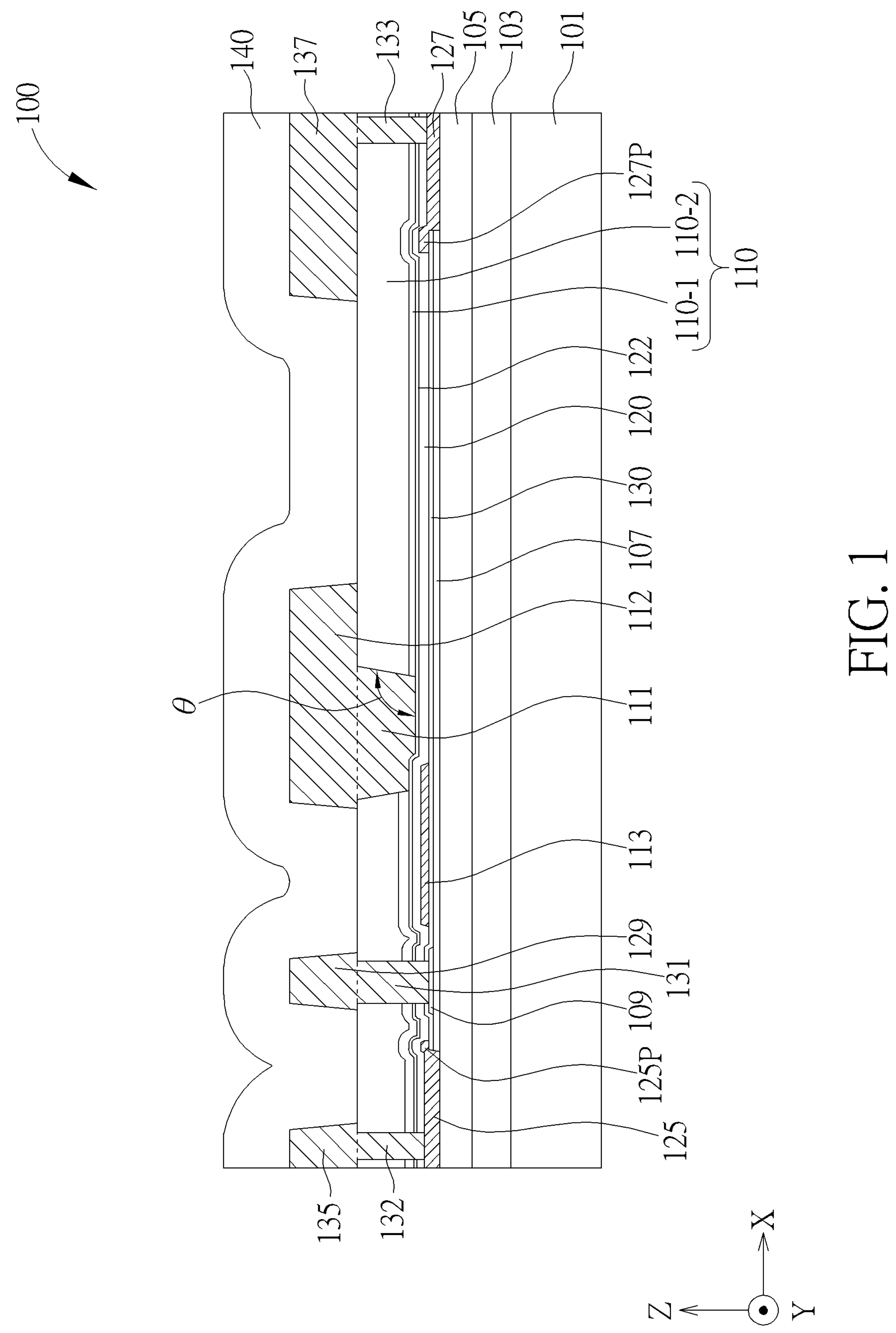
FIG. 1 is a schematic cross-sectional view of a high electron mobility transistor (HEMT) according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "compound semiconductor" refers to a group III-V compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, compound semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to high electron mobility transistors (HEMTs) including multiple field plates and fabrication methods thereof. In some embodiments of the present disclosure, three photo-masks and one metal layer are used to simultaneously fabricate two field plates, a gate electrode and three vias. The three vias are electrically connected to a source electrode, a drain electrode and a semiconductor cap layer, respectively. Therefore, the process steps and the cost of fabricating the HEMTs are reduced. Moreover, the multiple field plates achieve the effect of redistributing the electric field, thereby increasing the breakdown voltage of the HEMTs.

FIG. 1 is a schematic cross-sectional view of a high electron mobility transistor (HEMT) 100 according to an embodiment of the present disclosure. The HEMT 100 includes a substrate 101. In some embodiments, the material of the substrate 101 may include ceramics, silicon carbide (SiC), aluminum nitride (AlN), sapphire or silicon. When the substrate 101 is made of a material with high hardness, high thermal conductivity and low conductivity, such as a ceramic substrate, it is more suitable for high-voltage semiconductor devices. The aforementioned high hardness, high thermal conductivity and low electrical conductivity are compared with a single-crystal silicon substrate, and the high-voltage semiconductor devices refer to semiconductor devices with an operating voltage higher than 50V. In some embodiments, the substrate 101 may be a semiconductor-on-insulator (SOI) substrate. In some other embodiments, the substrate 101 may be provided by a composite substrate (or referred to as a QST substrate) composed of a core substrate wrapped around by a composite material layer. The composition of the core substrate includes ceramics, silicon carbide, aluminum nitride, sapphire or silicon. The composite material layer includes an insulating material layer and a semiconductor material layer. The insulating material layer may be single or multiple layers of silicon oxide, silicon nitride or silicon oxynitride. The semiconductor material layer may be silicon or polysilicon. In addition, during the fabrication of the HEMTs, the composite material layer on the backside of the core substrate may be removed by a thinning process, such as a grinding or an etching process, so that the backside of the core substrate is exposed.

In addition, the HEMT 100 includes a buffer layer 103, a semiconductor channel layer 105, and a semiconductor barrier layer 107 stacked on the substrate 101 in sequence from bottom to top. The buffer layer 103 may be used to reduce the degree of stress or lattice mismatch between the substrate 101 and the semiconductor channel layer 105. In some embodiments, a nucleation layer (not shown) may be disposed between the buffer layer 103 and the substrate 101. Moreover, a high resistance layer (or referred to as an electrical isolation layer) (not shown) may be disposed between the buffer layer 103 and the semiconductor channel layer 105. The compositions of the nucleation layer, the buffer layer 103, the high resistance layer, the semiconductor channel layer 105, and the semiconductor barrier layer 107 include compound semiconductors. In some embodiments, the nucleation layer is, for example, an aluminum nitride (AlN) layer. The buffer layer 103 may be a superlattice (SL) structure, for example, including a plurality of alternately stacked aluminum gallium nitride (AlGaN) layers and aluminum nitride (AlN) layers. The high resistance layer is, for example, a carbon-doped gallium nitride (C—GaN) layer. The semiconductor channel layer 105 is, for example, an undoped gallium nitride (u-GaN) layer. The semiconductor barrier layer 107 is a compound semiconductor layer with an energy gap greater than that of the semiconductor channel layer 105, for example, an aluminum gallium nitride (AlGaN) layer. The compositions of the aforementioned layers are for example, but not limited thereto. The compositions and structural arrangements of the aforementioned compound semiconductor layers of the HEMT 100 may be determined according to the requirements of various electronic components.

Still referring to FIG. 1, the HEMT 100 further includes a source electrode 125 and a drain electrode 127 disposed on the semiconductor channel layer 105. In some embodiments, the source electrode 125 and the drain electrode 127 may pass through the semiconductor barrier layer 107, and be extended downward into the semiconductor channel layer 105. In other embodiments, as shown in FIG. 1, the source electrode 125 and the drain electrode 127 may pass through the semiconductor barrier layer 107 and be located on the top surface of the semiconductor channel layer 105. In other embodiments, the source electrode 125 and the drain electrode 127 may be disposed on the top surface of the semiconductor barrier layer 107. In addition, a semiconductor cap layer 109 may be disposed on the semiconductor barrier layer 107. In one embodiment, the semiconductor cap layer 109 is, for example, a p-type gallium nitride (p-GaN) layer. Furthermore, a first dielectric layer 110 is disposed over the source electrode 125, the semiconductor cap layer 109 and the drain electrode 127. In one embodiment, the first dielectric layer 110 may include multiple layers of dielectric materials, such as a first sub-layer 110-1 and a second sub-layer 110-2. The composition of the first sub-layer 110-1 is, for example, silicon oxynitride (SiON), and the composition of the second sub-layer 110-2 is, for example, silicon oxide ($SiO_2$), but not limited thereto. Alternatively, the first dielectric layer 110 may be a single layer of dielectric material, and may include other dielectric materials with a low dielectric constant. In addition, a second dielectric layer 120 is also disposed on the source electrode 125, the semiconductor cap layer 109 and the drain electrode 127, and located below the first dielectric layer 110. The composition of the second dielectric layer 120 is, for example, silicon oxide ($SiO_2$). According to some embodiments of the present disclosure, the HEMT 100 further includes an etch stop layer (or referred to as a contact etch stop layer, CESL) 122 disposed on the second dielectric layer 120. In one embodiment, the composition of the etch stop layer 122 is, for example, silicon nitride ($SiN_x$).

In addition, the HEMT 100 includes a first via 131 to pass through the first dielectric layer 110, the etch stop layer 122, and the second dielectric layer 120, and be extended downward onto the semiconductor cap layer 109 to be in contact with the top surface of the semiconductor cap layer 109. A gate electrode 129 is disposed on the first dielectric layer 110 and in contact with the first via 131. According to some embodiments of the present disclosure, as shown in FIG. 1, the bottom surface of the gate electrode 129 and the top surface of the first dielectric layer 110 are on the same plane. The entire first via 131 is located in other dielectric layer that is disposed above the first dielectric layer 110, the etch stop layer 122, the second dielectric layer 120 and the semiconductor cap layer 109. The top surface of the first via 131 and the top surface of the first dielectric layer 110 are on the same plane. In addition, the gate electrode 129 and the first via 131 are formed of the same conductive material, so that there is no interface between the gate electrode 129 and the first via 131. Moreover, in one embodiment, the HEMT 100 includes the semiconductor cap layer 109, and a voltage is applied on the semiconductor cap layer 109 through the first via 131 and the gate electrode 129, thereby constructing an enhanced mode HEMT.

According to some embodiments of the present disclosure, the HEMT 100 at least includes a first field plate 111 disposed in the first dielectric layer 110, and a second field plate 112 disposed on the first dielectric layer 110, where the second field plate 112 is in contact with the first field plate 111. As shown in FIG. 1, the top surface of the first field plate 111 and the top surface of the first dielectric layer 110 are on the same plane, and the bottom surface of the first field plate 111 is in contact with the top surface of the etch stop layer 122. The bottom surface of the second field plate 112 and the top surface of the first dielectric layer 110 are on the same plane. The entire second field plate 112 is located above the top surface of the first dielectric layer 110, and the entire first field plate 111 is located below the top surface of the first dielectric layer 110. Accordingly, the distance between the first field plate 111 and the semiconductor channel layers 105 is different from the distance between the second field plate 112 and the semiconductor channel layers 105, thereby producing the effect of at least two field plates. In addition, the first field plate 111 and the second field plate 112 are formed of the same conductive material, so that there is no interface between the first field plate 111 and the second field plate 112.

In addition, according to some embodiments of the present disclosure, the first field plate 111 is formed by etching the first dielectric layer 110 to form an opening, and then filling up the opening with a conductive material. Through adjusting the parameters of the etching process, the angle between the sidewall and the bottom surface of the opening may be controlled to be an obtuse angle. Therefore, an angle θ between the sidewall and the bottom surface of the first field plate 111 is greater than 90 degrees, and the cross-sectional area of the first field plate 111 is gradually increased from bottom to top. Since the angle between the sidewall and the bottom surface of the first field plate 111 is an obtuse angle, it can avoid the electric field concentrating at the corner of the bottom edge of the first field plate 111, thereby dispersing the electric field more effectively to improve the breakdown voltage of the HEMT 100.

Still referring to FIG. 1, the HEMT 100 further includes a second via 132 and a third via 133. Both the second via 132 and the third via 133 pass through the first dielectric layer 110, the etch stop layer 122 and the second dielectric layer 120, and are extended downward onto the source electrode 125 and the drain electrode 127, respectively. The second via 132 is in contact with the top surface of the source electrode 125 to generate an electrical connection. The third via 133 is in contact with the top surface of the drain electrode 127 to generate an electrical connection. In addition, both a first wire 135 and a second wire 137 are disposed on the first dielectric layer 110. The first wire 135 is electrically connected to the second via 132, and the second wire 137 is electrically connected to the third via 133. According to some embodiments of the present disclosure, the first wire 135 and the second via 132 are formed of the same conductive material, so that there is no interface between the first wire 135 and the second via 132. The second wire 137 and the third via 133 are also formed of the same conductive material, so that there is no interface between the second wire 137 and the third via 133. Moreover, according to some embodiments of the present disclosure, in the HEMT 100, the first field plate 111, the second field plate 112, the first via 131, the gate electrode 129, the second via 132, the third via 133, the first wire 135, the second wire 137 and the third wire (not shown) connected to the gate electrode 129 are all constructed of a first metal layer.

In one embodiment, as shown in FIG. 1, the HEMT 100 may further include a third field plate 113 disposed below the second dielectric layer 120 and located between the first via 131 and the first field plate 111. The first field plate 111 and the third field plate 113 may partially overlap in the vertical projection direction (for example, on the XY plane), so that the first field plate 111 has a step in height. Moreover, according to some embodiments of the present disclosure, the source electrode 125, the drain electrode 127 and the third field plate 113 are all constructed of a second metal layer. In addition, the HEMT 100 may include a third dielectric layer 130 disposed on the semiconductor barrier layer 107. The third dielectric layer 130 has an opening to expose the semiconductor cap layer 109, so that the first via 131 is in contact with and electrically connected to the semiconductor cap layer 109 through the opening in the third dielectric layer 130. In some embodiments, a portion 125P of the source electrode 125 and a portion 127P of the drain electrode 127 both are extended onto the top surface of the third dielectric layer 130, such that the portion 125P of the source electrode 125 and the portion 127P of the drain electrode 127 also have the effect of multiple field plates.

In addition, a passivation layer 140 may be formed to cover the second field plate 112, the gate electrode 129, the first wire 135 and the second wire 137 for protecting the HEMT 100. The composition of the passivation layer 140 is, for example, silicon nitride, silicon oxynitride, other dielectric materials, insulating polymers (such as epoxy resin) or other insulating materials. Moreover, according to an embodiment of the present disclosure, the first field plate 111, the second field plate 112 and the third field plate 113 may be electrically connected to the source electrode 125 through other vias (not shown) and/or other wires (not shown). The source electrode 125 may be electrically coupled to a ground terminal, thereby further reducing the maximum electric field intensity and increasing the breakdown voltage of the HEMT.

Figure 2:
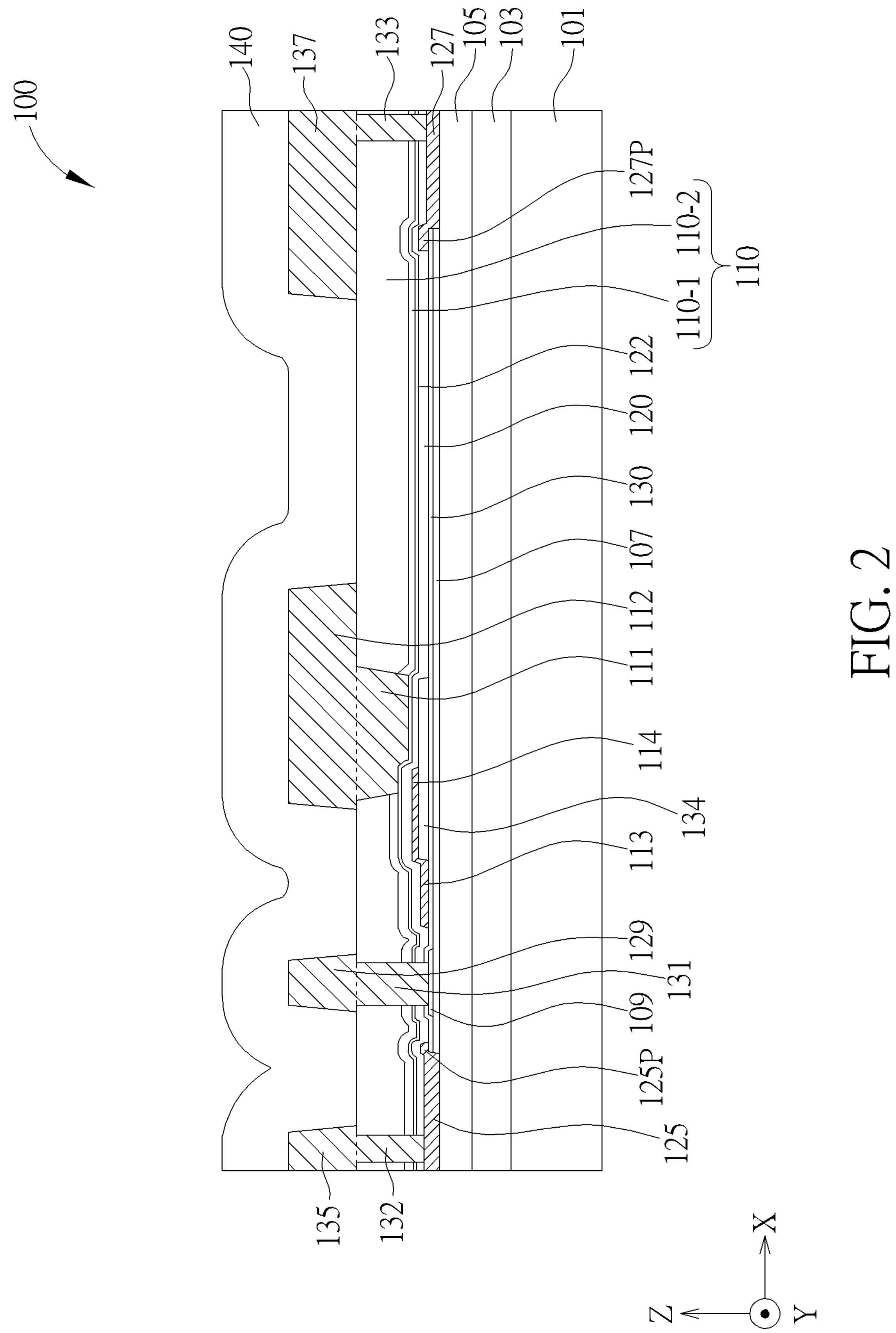
FIG. 2 is a schematic cross-sectional view of a HEMT according to another embodiment of the present disclosure.

FIG. 2 is a schematic cross-sectional view of a HEMT 100 according to another embodiment of the present disclosure. The HEMT 100 of FIG. 2 further includes a dielectric segment 134 disposed on the third dielectric layer 130. The dielectric segment 134 is located between the semiconductor cap layer 109 and the drain electrode 127, and laterally separated from the semiconductor cap layer 109 and the drain electrode 127. The dielectric segment 134 may be extended from a position between the semiconductor cap layer 109 and the first field plate 111 toward the drain electrode 127. In one embodiment, the dielectric segment 134 may be extended to align with the right edge of the first field plate 111 (as shown in FIG. 2). In another embodiment, the dielectric segment 134 may be extended to abut the drain electrode 127, and the portion 127P of the drain electrode 127 may be further extended laterally onto the top surface of the dielectric segment 134, such that the portion 127P of the drain electrode 127 has a step in height to achieve the effect of two field plates. In some embodiments, the dielectric segment 134 may be formed of a high dielectric constant material with a dielectric constant higher than those of the second dielectric layer 120 and the third dielectric layer 130. For example, the dielectric constant of the dielectric segment 134 may be higher than 3.9 (i.e., the dielectric constant of silicon dioxide). The composition of the dielectric segment 134 is, for example, silicon nitride ($Si_3N_4$), yttrium oxide ($Y_2O_3$), yttrium titanium oxide ($Y_2TiO_5$), ytterbium oxide ($Yb_2O_3$), hafnium oxide ($HfO_2$), zirconia ($ZrO_2$), titanium oxide ($TiO_2$), aluminum oxide ($Al_2O_3$), tantalum oxide ($Ta_2O_5$), silicon oxynitride ($SiO_xN_y$) or other high dielectric constant materials. In other embodiments, the dielectric constant of the dielectric segment 134 may be slightly higher than or equal to the dielectric constants of the second dielectric layer 120 and the third dielectric layer 130. For example, the dielectric constant of the dielectric segment 134 may be slightly higher or equal to 3.9 (i.e., the dielectric constant of silicon dioxide). The composition of the dielectric segment 134 is, for example, silicon dioxide or silicon oxynitride.

In addition, the HEMT 100 of FIG. 2 includes a third field plate 113 abutting one side (for example, the left side) of the dielectric segment 134, and a fourth field plate 114 located on the top surface of the dielectric segment 134. The third field plate 113 and the fourth field plate 114 are connected to each other and continuously extended from the left side of the dielectric segment 134 onto the top surface of the dielectric segment 134. In one embodiment, when viewed from the cross section, the fourth field plate 114 and the dielectric segment 134 may construct a step structure, so that the bottom surface of the first field plate 111 formed directly above the fourth field plate 114 and the dielectric segment 134 also has a step in height. Therefore, the first field plate 111 has the effect of two field plates. Moreover, according to some embodiments of the present disclosure, the source electrode 125, the drain electrode 127, the third field plate 113 and the fourth field plate 114 are all constructed of the second metal layer, thereby reducing the process steps and the costs of fabricating the HEMT. Other features of the HEMT 100 in FIG. 2 may refer to the aforementioned description of the HEMT 100 in FIG. 1, and will not be repeated here.

Figure 3:
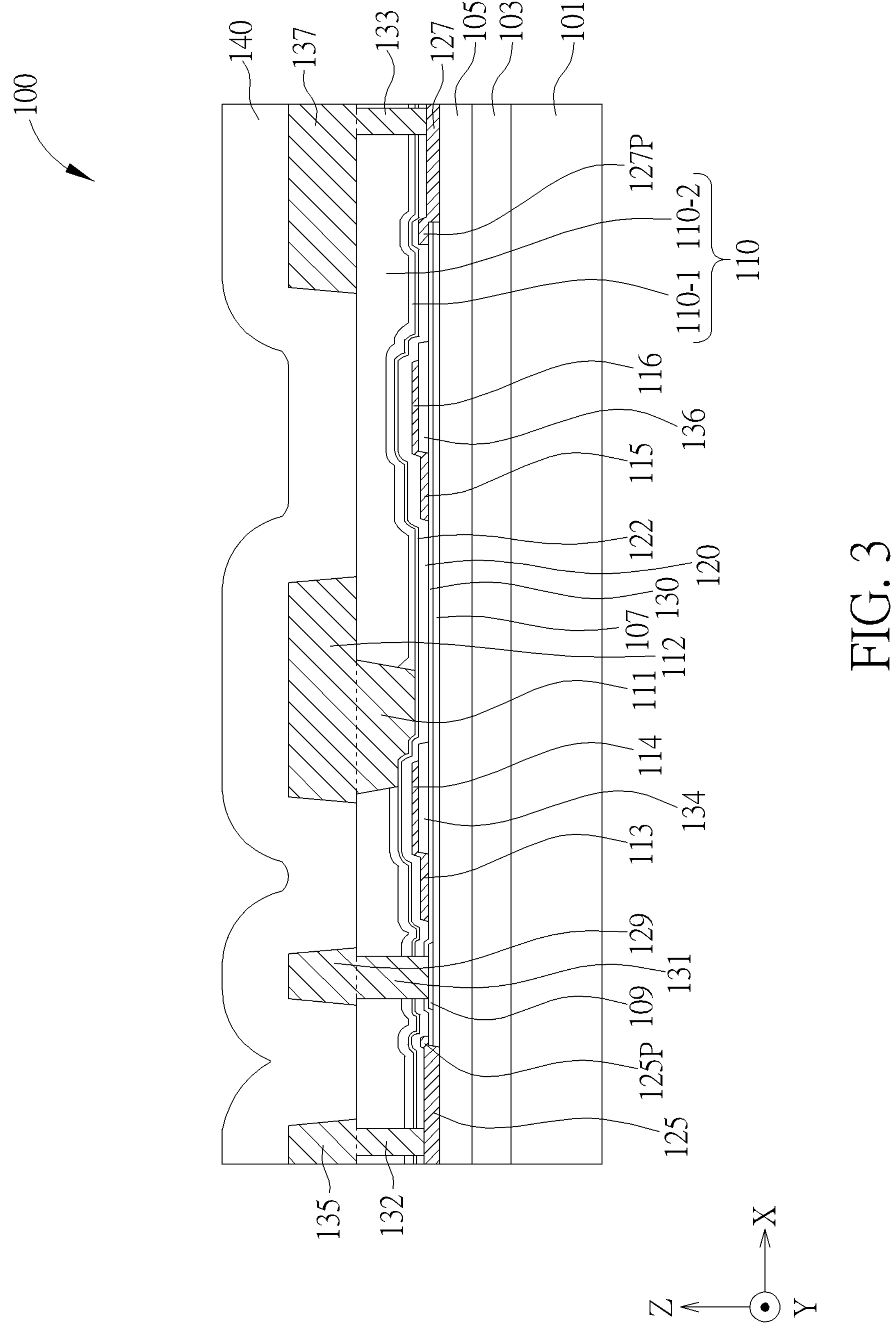
FIG. 3 is a schematic cross-sectional view of a HEMT according to further another embodiment of the present disclosure.

FIG. 3 is a schematic cross-sectional view of a HEMT 100 according to further another embodiment of the present disclosure. In the HEMT 100 of FIG. 3, a dielectric segment 134 may be extended to a middle position of the first field plate 111. The first field plate 111, the fourth field plate 114 and the dielectric segment 134 all partially overlap in the vertical projection direction (for example, on the XY plane), so that the bottom surface of the first field plate 111 directly above the fourth field plate 114 and the dielectric segment 134 has two steps in height. Therefore, the first field plate 111 has the effect of three field plates. In addition, the HEMT 100 of FIG. 3 includes another dielectric segment 136 disposed on the third dielectric layer 130 and located between the first field plate 111 and the drain electrode 127. In one embodiment, the dielectric segment 136 may be laterally separated from both the first field plate 111 and the drain electrode 127. Moreover, the HEMT 100 of FIG. 3 includes a fifth field plate 115 abutting one side (for example, the left side) of the dielectric segment 136, and a sixth field plate 116 located on the top surface of the dielectric segment 136. The fifth field plate 115 and the sixth field plate 116 are connected to each other and continuously extended from the left side of the dielectric segment 136 onto the top surface of the dielectric segment 136. According to some embodiments of the present disclosure, the source electrode 125, the drain electrode 127, the third field plate 113, the fourth field plate 114, the fifth field plate 115 and the sixth field plate 116 are all constructed of the second metal layer. Furthermore, in one embodiment, the dielectric segment 134 and the dielectric segment 136 may have the same composition and be formed simultaneously by depositing and patterning the same dielectric material layer, thereby reducing the process steps and the cost of fabricating the HEMT. The compositions of the dielectric segment 134 and the dielectric segment 136 may refer to the aforementioned description of FIG. 2, and will not be repeated here.

In one embodiment, the dielectric segment 136 may be extended laterally to abut the drain electrode 127, and the portion 127P of the drain electrode 127 may be further extended laterally onto the top surface of the dielectric segment 136, so that the portion 127P of the drain electrode 127 has a step in height to achieve the effect of two field plates. In another embodiment, the dielectric segment 136 may be extended laterally to be directly below the first field plate 111 and separated laterally from the dielectric segment 134, so that the bottom surface of the first field plate 111 at the right side has a step in height to achieve the effect of two field plates for adjusting the electric field distribution. In other embodiment (not shown), the sixth field plate 116 may abut one side (such as the right side) of the dielectric segment 136, and the fifth field plate 115 may be located on the top surface of the dielectric segment 136. The fifth field plate 115 and the sixth field plate 116 are connected to each other and continuously extended from the right side of the dielectric segment 136 onto the top surface of the dielectric segment 136. The other features of the HEMT 100 in FIG. 3 may refer to the aforementioned description of the HEMT 100 in FIG. 1, and will not be repeated here. According to some embodiments of the present disclosure, the effect of multiple field plates may be generated by the configurations of the dielectric segments and the metal layers. Moreover, the positions of the dielectric segments and the field plates may be adjusted according to the electrical requirements of the HEMT, thereby redistributing the electric field to satisfy various electrical requirements of the HEMT.

Figure 4:
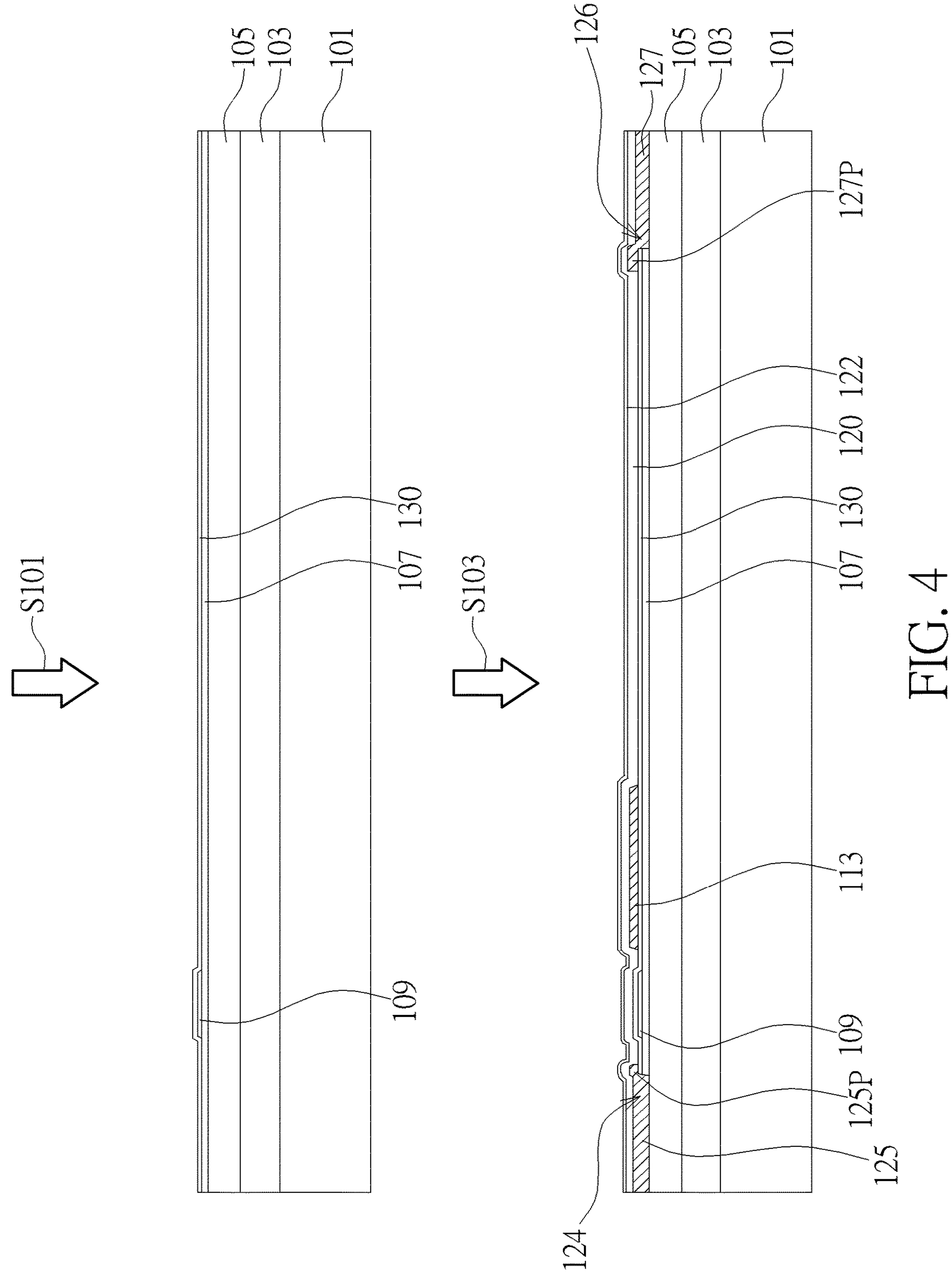
FIG. 4, FIG. 5, FIG. 6 and FIG. 7 are schematic cross-sectional views of some stages of a method of fabricating a HEMT according to an embodiment of the present disclosure.

FIG. 4, FIG. 5, FIG. 6 and FIG. 7 are schematic cross-sectional views of some stages of a method of fabricating a HEMT according to an embodiment of the present disclosure. Referring to FIG. 4, in step S101, firstly, a substrate 101 is provided, and then a buffer layer 103, a semiconductor channel layer 105 and a semiconductor barrier layer 107 are formed on the substrate 101 in sequence. Next, a semiconductor cap layer 109 may be formed on the semiconductor barrier layer 107 by deposition and patterning processes. Afterwards, a third dielectric layer 130 is deposited to cover the semiconductor cap layer 109 and the semiconductor barrier layer 107. The compositions of some features and/or material layers in FIG. 4, FIG. 5, FIG. 6 and FIG. 7 may refer to the aforementioned description of FIG. 1, and will not be repeated here.

Next, still referring to FIG. 4, in step S103, an opening 124 for a source electrode and an opening 126 for a drain electrode are formed in the third dielectric layer 130, the semiconductor barrier layer 107 and the semiconductor channel layer 105 by an etching process. In some embodiments, through controlling an etching depth, the bottom surfaces of the openings 124 and 126 may be positioned on the top surface of the semiconductor barrier layer 107, or on the top surface of the semiconductor channel layer 105, or at a position in the semiconductor channel layer 105. Then, a second metal layer is deposited on the third dielectric layer 130 and fills up the openings 124 and 126. In some embodiments, the composition of the second metal layer is, for example, titanium (Ti), aluminum (Al), nickel (Ni), molybdenum (Mo), gold (Au), tantalum (Ta), titanium nitride (TiN), tantalum nitride (TaN) or a multi-layered stack structure of the aforementioned metal layers. Next, the second metal layer is patterned by photolithography and etching processes to simultaneously form a source electrode 125, a drain electrode 127 and a third field plate 113. The source electrode 125 is located in the opening 124 and formed on the semiconductor channel layer 105. A portion 125P of the source electrode 125 may be extended onto the top surface of the third dielectric layer 130. The drain electrode 127 is located in the opening 126 and formed on the semiconductor channel layer 105. A portion 127P of the drain electrode 127 may also be extended onto the top surface of the third dielectric layer 130. The third field plate 113 is formed on the top surface of the third dielectric layer 130. Moreover, the third field plate 113 is laterally separated from both the semiconductor cap layer 109 and the drain electrode 127, and the third field plate 113 is located between the semiconductor cap layer 109 and the drain electrode 127. Then, a second dielectric layer 120 and an etch stop layer 122 are conformally deposited on the third dielectric layer 130 in sequence to cover the source electrode 125, the semiconductor cap layer 109, the third field plate 113 and the drain electrode 127.

Figure 5:
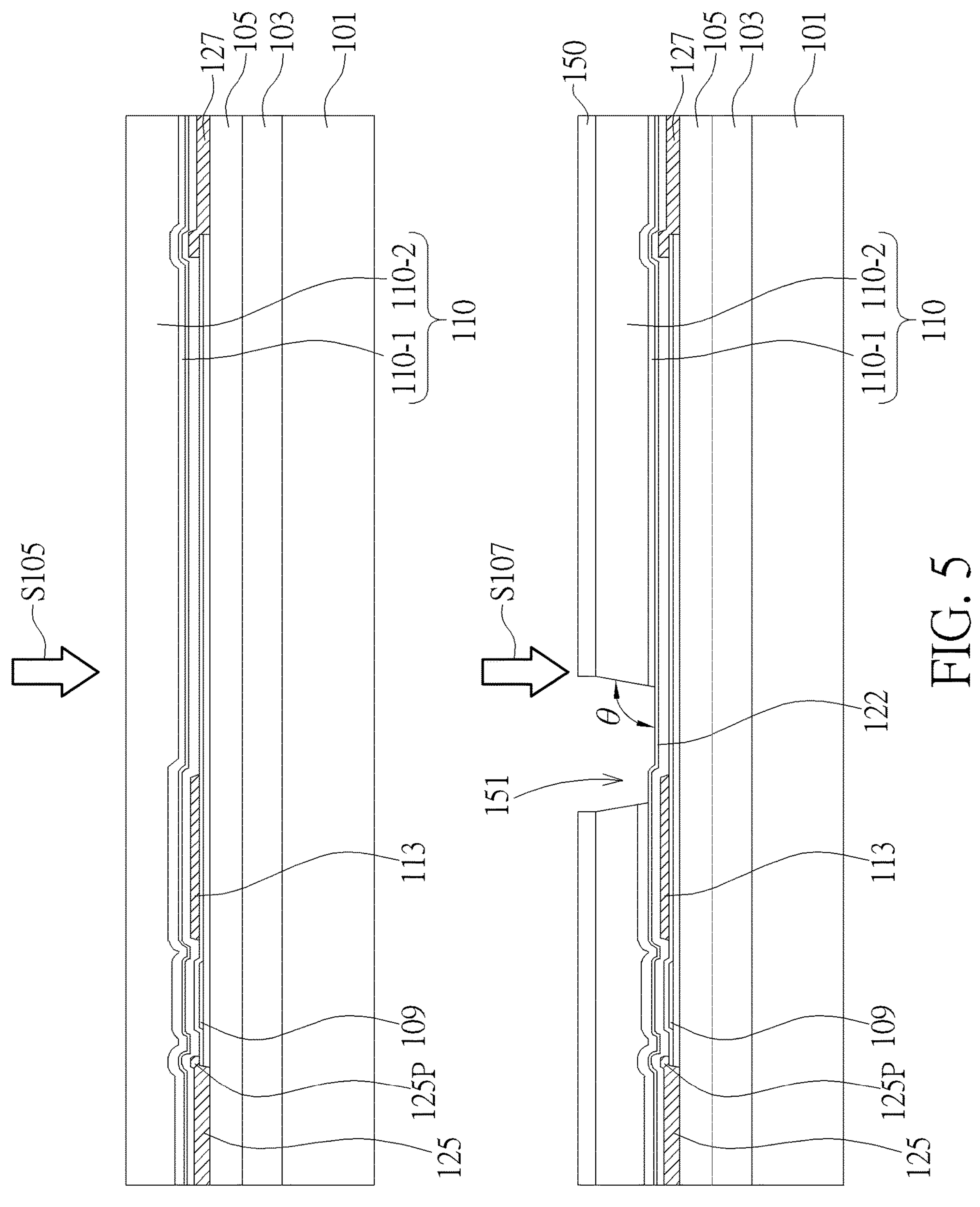

Next, referring to FIG. 5, in step S105, a first sub-layer 110-1 and a second sub-layer 110-2 of a first dielectric layer 110 are deposited on the etch stop layer 122 in sequence, and then a chemical mechanical planarization (CMP) process is performed on the second sub-layer 110-2, so that the first dielectric layer 110 has a flat surface. The first dielectric layer 110 covers the source electrode 125, the semiconductor cap layer 109, the third field plate 113 and the drain electrode 127.

Still referring to FIG. 5, in step S107, a patterned mask 150 is formed on the flat surface of the first dielectric layer 110 by using a first photo-mask (not shown) and performing deposition, photolithography and etching processes. Then, a first opening 151 is formed in the first dielectric layer 110 by a first etching process through the opening of the patterned mask 150. According to some embodiments of the present disclosure, the first etching process is stopped on the etch stop layer 122, so that the bottom surface of the first opening 151 is located on the etch stop layer 122. Moreover, through adjusting the parameters of the first etching process, an angle θ between the sidewall and the bottom surface of the first opening 151 is greater than 90 degrees to be an obtuse angle. In addition, through the position of the opening in the patterned mask 150, the first opening 151 may partially overlap the third field plate 113 in the vertical projection direction, so that the bottom surface of the first opening 151 has a step in height. Afterwards, the patterned mask 150 may be removed by a stripping process, such as an ashing or a soaking process.

Figure 6:
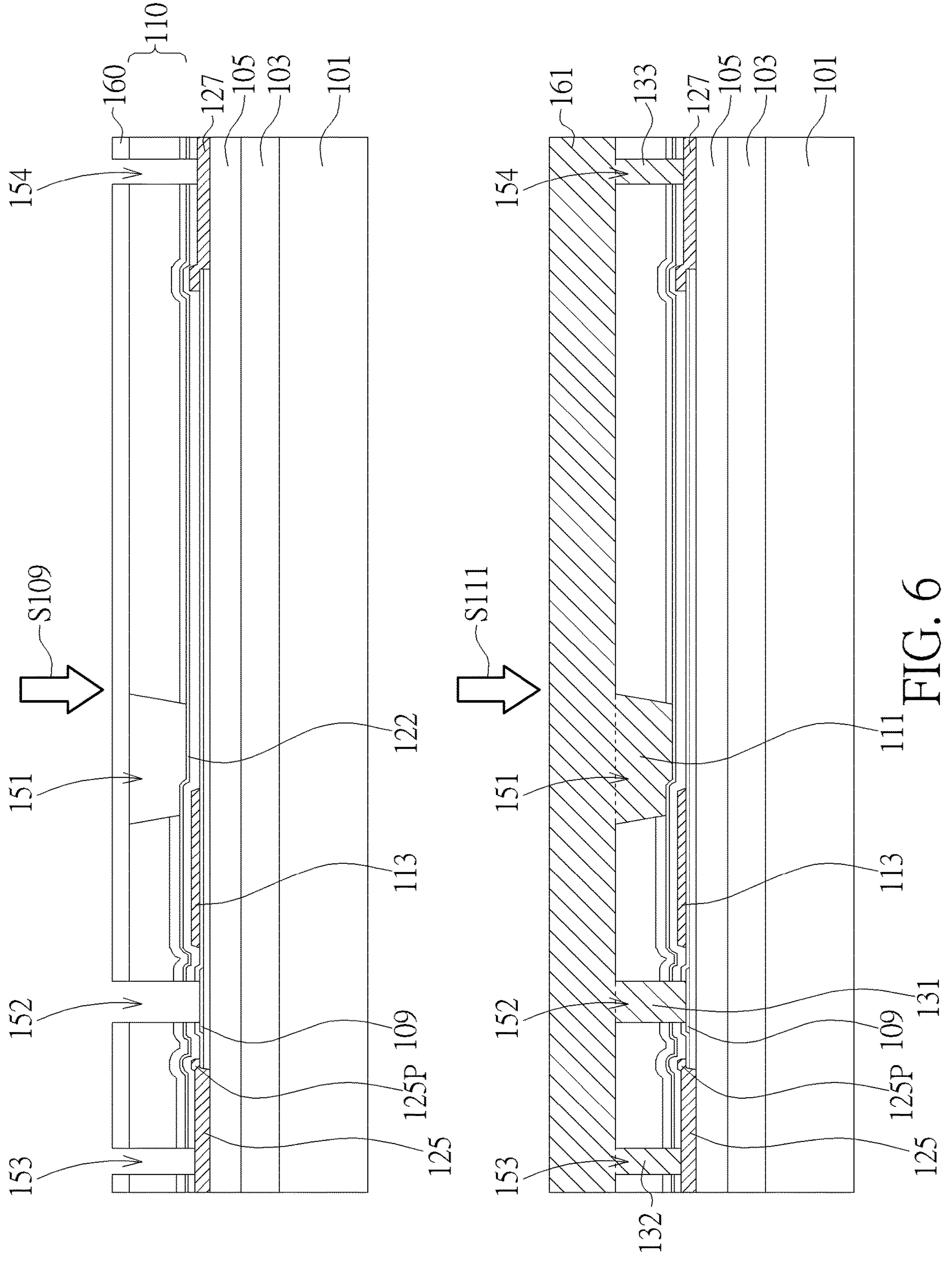

Next, referring to FIG. 6, in step S109, after the patterned mask 150 is removed, another patterned mask 160 is formed on the flat surface of the first dielectric layer 110 by using a second photo-mask (not shown) and performing deposition, photolithography and etching processes. Then, a second opening 152, a third opening 153 and a fourth opening 154 are formed to pass through the first dielectric layer 110, the etch stop layer 122, the second dielectric layer 120 and the third dielectric layer 130 by a second etching process through multiple openings of the patterned mask 160. The semiconductor cap layer 109 is exposed through the second opening 152, the source electrode 125 is exposed through the third opening 153, and the drain electrode 127 is exposed through the fourth opening 154. Afterwards, the patterned mask 160 may be removed by a stripping process.

Still referring to FIG. 6, in step S111, after the patterned mask 160 is removed, a first metal layer 161 is deposited on the first dielectric layer 110 and further fills up the first opening 151, the second opening 152, the third opening 153 and the fourth opening 154 to form a first field plate 111 in the first opening 151, a first via 131 in the second opening 152, a second via 132 in the third opening 153, and a third via 133 in the fourth opening 154. The bottom surface of the first field plate 111 formed in the first opening 151 has a step in height. The first via 131 is formed on the semiconductor cap layer 109 to be a gate contact. The second via 132 is formed on the source electrode 125 to be a source contact. The third via 133 is formed on the drain electrode 127 to be a drain contact. In some embodiments, the composition of the first metal layer 161 is, for example, a metal, polysilicon or a silicide. The metal is, for example, nickel (Ni), gold (Au), platinum (Pt), tungsten (W), titanium (Ti), aluminum (Al), molybdenum (Mo) or a multi-layered stack structure of the aforementioned metal layers. The silicide is, for example, a silicide formed from the aforementioned metals.

Figure 7:
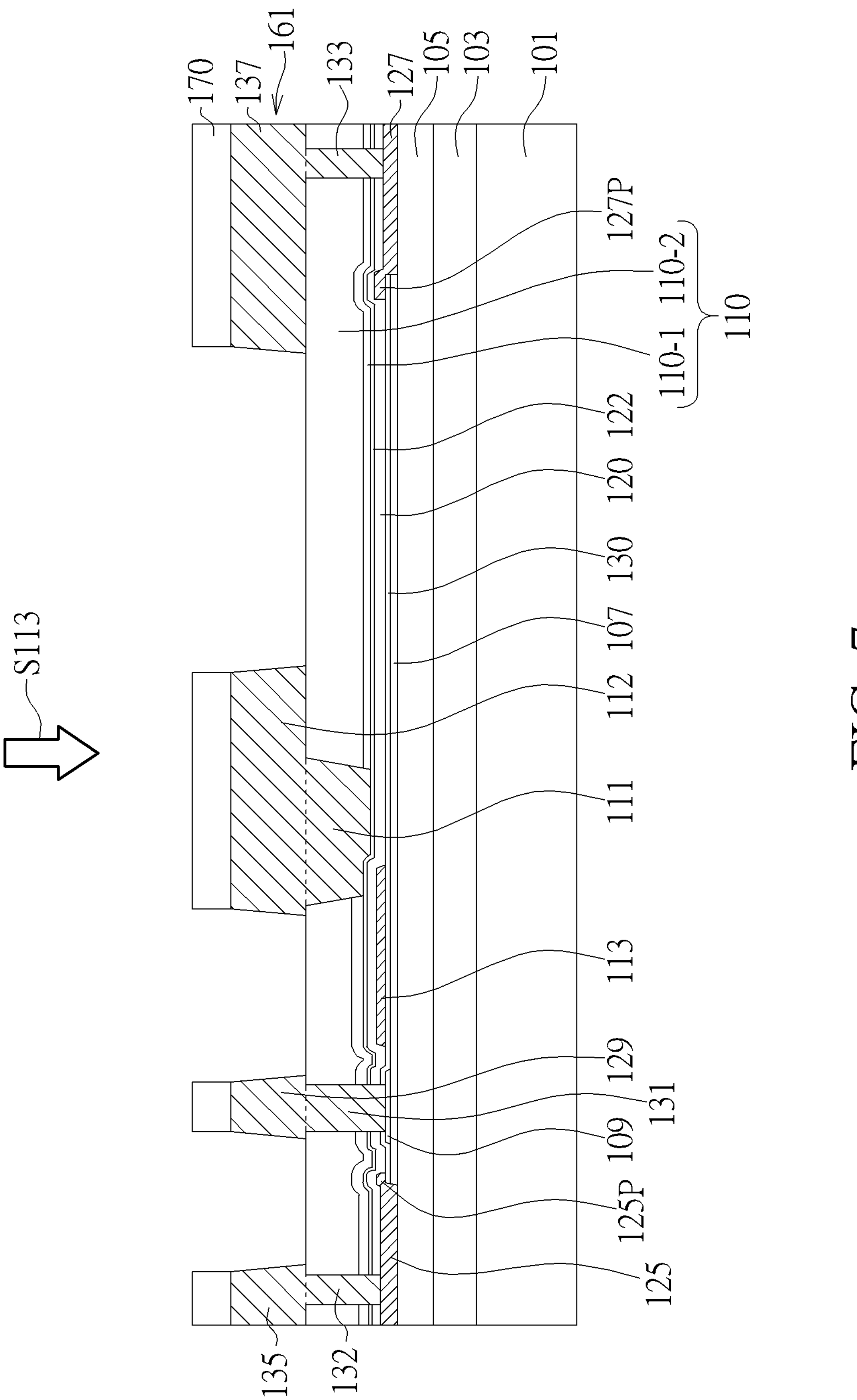

Next, referring to FIG. 7, in step S113, another patterned mask 170 is formed on the surface of the first metal layer 161 by using a third photo-mask (not shown) and performing deposition, photolithography and etching processes. Then, the first metal layer 161 is patterned to form a second field plate 112, a gate electrode 129, a first wire 135 and a second wire 137 by a third etching process through multiple openings of the patterned mask 170. In addition, a third wire (not shown) connected to the gate electrode 129 is also formed at the same time by patterning the first metal layer 161. The second field plate 112 is in contact with the first field plate 111, and the entire second field plate 112 is located above the first field plate 111. The gate electrode 129 is in contact with and electrically connected to the first via 131, and the gate electrode 129 is located directly above the semiconductor cap layer 109. The first wire 135 is electrically connected to the second via 132, so that the first wire 135 is electrically coupled to the source electrode 125. The second wire 137 is electrically connected to the third via 133, so that the second wire 137 is electrically coupled to the drain electrode 127. Thereafter, the patterned mask 170 may be removed by a stripping process. Then, a passivation layer 140 is formed by a deposition process to cover the second field plate 112, the gate electrode 129, the first wire 135, the second wire 137 and the first dielectric layer 110 to complete the HEMT 100 of FIG. 1.

Figure 8:
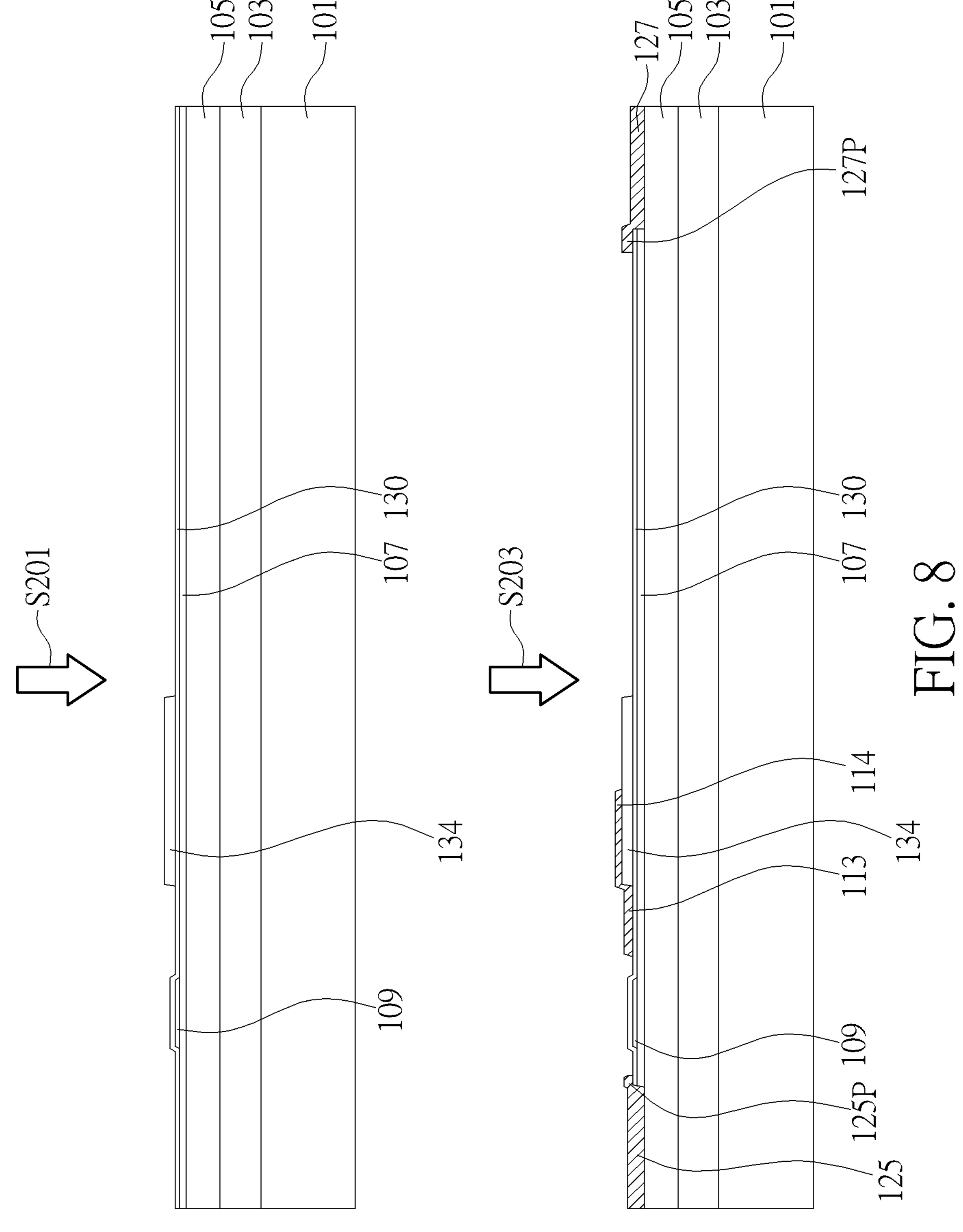
FIG. 8, FIG. 9 and FIG. 10 are schematic cross-sectional views of some stages of a method of fabricating a HEMT according to another embodiment of the present disclosure.
Figure 9:
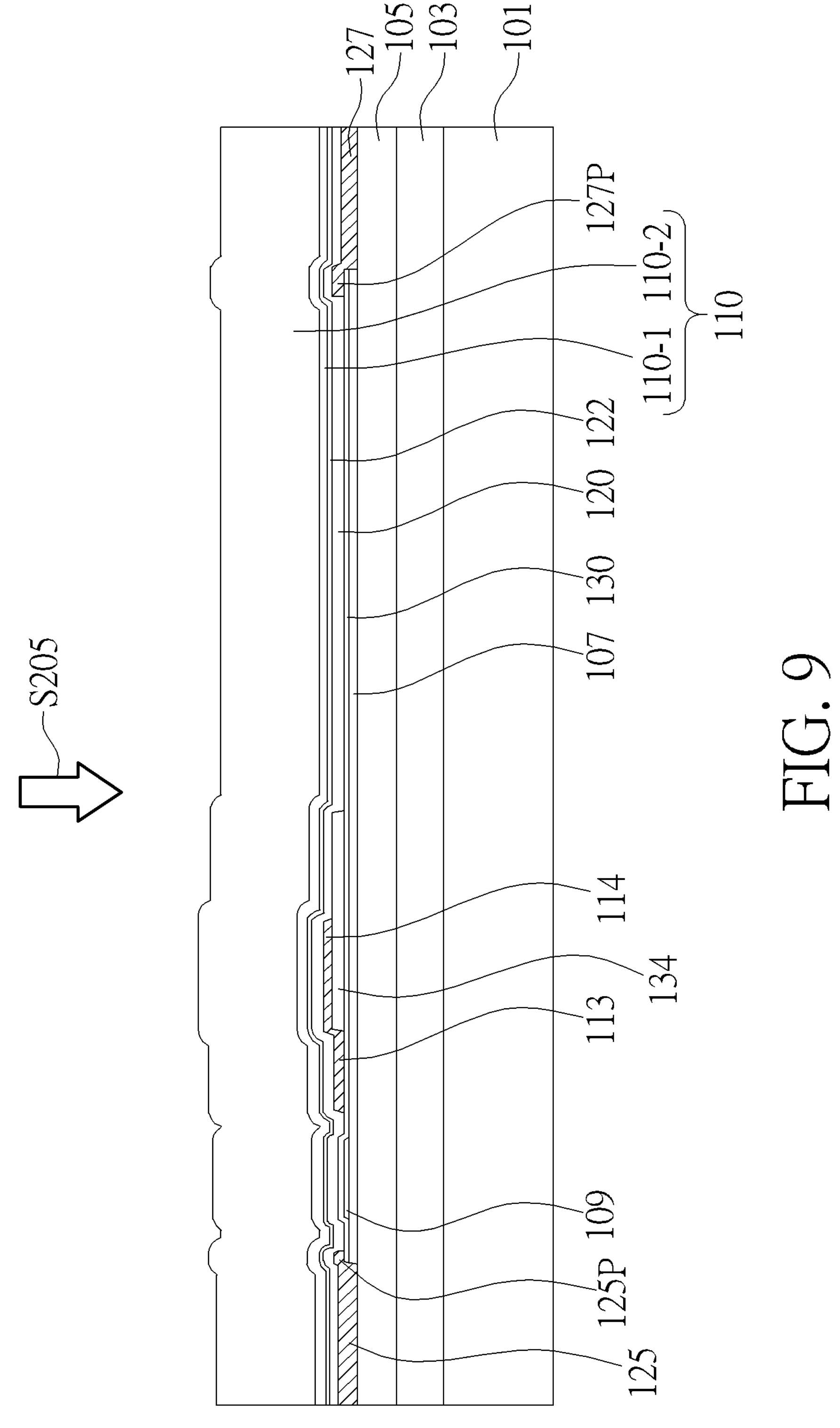
Figure 10:
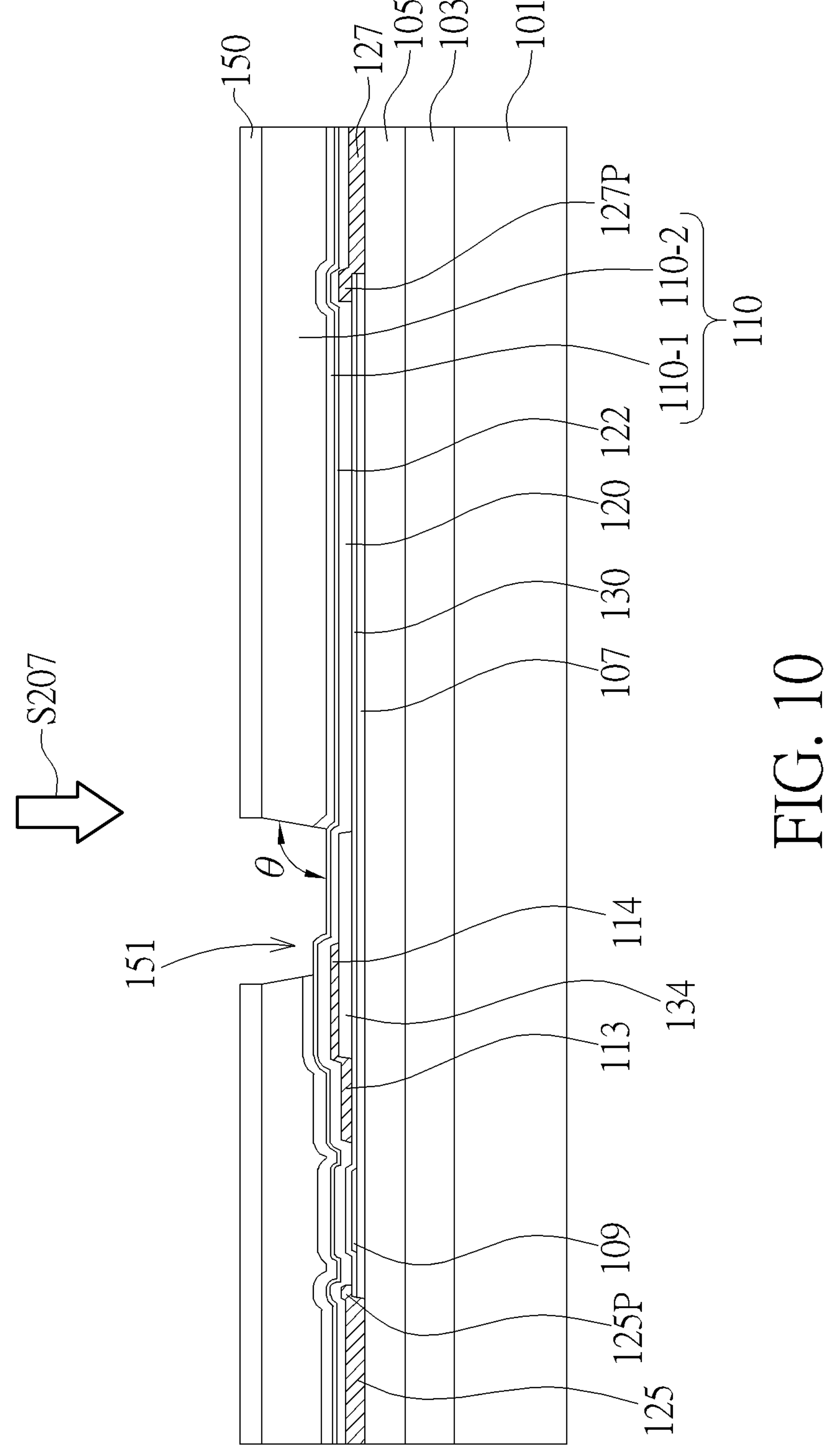

FIG. 8, FIG. 9 and FIG. 10 are schematic cross-sectional views of intermediate stages of a method of fabricating a HEMT according to another embodiment of the present disclosure. Firstly, referring to the aforementioned description of FIG. 4, the step S101 is performed. After the step S101 is completed, referring to FIG. 8, in step S201, a dielectric segment 134 is formed on the third dielectric layer 130 by using a fourth photo-mask (not shown) and performing deposition, photolithography and etching processes. The dielectric segment 134 is laterally separated from the semiconductor cap layer 109 and located on the semiconductor barrier layer 107.

Still referring to FIG. 8, in step S203, an opening 124 for a source electrode and an opening 126 for a drain electrode are formed in the third dielectric layer 130 and the semiconductor barrier layer 107 by an etching process. The details may refer to the aforementioned description of the step S103 in FIG. 4. Then, a second metal layer is deposited on the semiconductor channel layer 105, the third dielectric layer 130 and the dielectric segment 134, and fills up the opening 124 and the opening 126. Next, the second metal layer is patterned by using a fifth photo-mask (not shown) and performing photolithography and etching processes to simultaneously form a source electrode 125, a drain electrode 127, a third field plate 113 and a fourth field plate 114. The source electrode 125 fills up the opening 124 and is formed on the semiconductor channel layer 105. A portion 125P of the source electrode 125 may be extended onto the top surface of the third dielectric layer 130. The drain electrode 127 fills up the opening 126 and is formed on the semiconductor channel layer 105. A portion 127P of the drain electrode 127 may also be extended onto the top surface of the third dielectric layer 130. The third field plate 113 abuts one side of the dielectric segment 134. The fourth field plate 114 is formed on the top surface of the dielectric segment 134. The third field plate 113 and the fourth field plate 114 are connected to each other and extended continuously from the aforementioned side of the dielectric segment 134 onto the top surface of the dielectric segment 134. The third field plate 113 is laterally separated from the semiconductor cap layer 109, and the fourth field plate 114 is laterally separated from the drain electrode 127.

In other embodiments, in step S201 of FIG. 8, another dielectric segment such as the dielectric segment 136 as shown in FIG. 3 may also be formed at the same time. Moreover, in step S203 of FIG. 8, other field plates such as the fifth field plate 115 and the sixth field plate 116 as shown in FIG. 3 may be formed at the same time. According to some embodiments of the present disclosure, the source electrode 125, the drain electrode 127, multiple dielectric segments and multiple field plates located between the semiconductor cap layer 109 and the drain electrode 127 may be formed simultaneously by using two photo-masks and one metal layer.

Next, referring to FIG. 9, in step S205, a second dielectric layer 120, an etch stop layer 122, a first sub-layer 110-1 and a second sub-layer 110-2 of a first dielectric layer 110 are conformally deposited in sequence over the source electrode 125, the drain electrode 127, the semiconductor cap layer 109, the third dielectric layer 130, the third field plate 113, the fourth field plate 114 and the dielectric segment 134. As shown in FIG. 9, after the deposition process is completed, the second sub-layer 110-2 of the first dielectric layer 110 has an uneven surface profile.

Then, referring to FIG. 10, in step S207, a CMP process is performed on the second sub-layer 110-2 of the first dielectric layer 110, so that the first dielectric layer 110 has a flat surface. Next, referring to the aforementioned description of the step S107 in FIG. 5, a patterned mask 150 is formed on the flat surface of the first dielectric layer 110, and then a first opening 151 is formed in the first dielectric layer 110 by the first etching process through the opening of the patterned mask 150. According to some embodiments of the present disclosure, the first etching process is stopped on the etch stop layer 122, and the angle θ between the sidewall and the bottom surface of the first opening 151 may be greater than 90 degrees to be an obtuse angle. Afterwards, referring to the aforementioned descriptions of the step S109 and the step S111 in FIG. 6 and the step S113 in FIG. 7, the subsequent process steps are performed to complete the HEMTs 100 of FIG. 2 and FIG. 3.

According to some embodiments of the present disclosure, the first field plate, the second field plate, the gate contact, the gate electrode, the gate wire, the source contact, the source wire, the drain contact, and the drain wire may be formed simultaneously by using three photo-masks and one metal layer, thereby reducing the process steps and the cost of fabricating the HEMTs. Moreover, since the first field plate is formed in the first opening of the first dielectric layer, the angle θ between the sidewall and the bottom surface of the first field plate may be greater than 90 degrees to be an obtuse angle, thereby avoiding the electric field concentrating at the corners of the bottom edge of the first field plate to disperse the electric field more effectively, and further increasing the breakdown voltage of the HEMTs.

Furthermore, in some embodiments of the present disclosure, the dielectric segments formed on the semiconductor barrier layer and located between the semiconductor cap layer and the drain electrode may be used to form the source electrode, the drain electrode, and two field plates simultaneously by using one photo-mask and one metal layer, where the two field plates are extended continuously from one side of the dielectric segment onto the top surface of the dielectric segment. Therefore, the process steps and the cost of fabricating the HEMTs are further reduced.

In addition, according to some embodiments of the present disclosure, the first field plate is disposed between the gate electrode and the drain electrode of the HEMT, and the first field plate may be electrically coupled to the source electrode or the ground terminal. The first field plate can provide a shielding effect on the capacitance between the gate electrode and the drain electrode, thereby reducing both the gate to drain capacitance (Cgd) and the reverse transfer capacitance (Crss) by about 2%. Moreover, the gate to source capacitance (Cgs) and the input power capacitance (Ciss) are substantially not affected, and the output power capacitance (Coss) is not changed. Therefore, the HEMTs of some embodiments of the present disclosure avoid Miller turn-on to reduce switching loss and shorten switching time, thereby improving the electrical performances and the reliability of the HEMTs. Moreover, according to some embodiments of the present disclosure, the electric field distribution required for the HEMTs are maintained under high voltage operating conditions of about 100V to about 800V applied to the drain electrode. Therefore, the HEMTs of the present disclosure are suitable for high voltage applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, comprising:

a semiconductor channel layer and a semiconductor barrier layer, disposed on a substrate in sequence;

a source electrode and a drain electrode, disposed on the semiconductor channel layer;

a semiconductor cap layer, disposed on the semiconductor barrier layer;

a first dielectric layer, disposed over the source electrode, the semiconductor cap layer and the drain electrode;

a second dielectric layer, disposed on the source electrode, the semiconductor cap layer and the drain electrode, and located below the first dielectric layer;

a first via, passing through the first dielectric layer and extended downward onto the semiconductor cap layer;

a gate electrode, disposed on the first dielectric layer and in contact with the first via;

a first field plate, disposed in the first dielectric layer;

a second field plate, disposed on the first dielectric layer and in contact with the first field plate; and a third field plate, disposed below the second dielectric layer and located between the first via and the first field plate, wherein the source electrode, the drain electrode, and the third field plate are all constructed of a second metal layer.

2. The high electron mobility transistor of claim 1, wherein the first via, the gate electrode, the first field plate and the second field plate are all constructed of a first metal layer.

3. The high electron mobility transistor of claim 1, wherein an angle between a sidewall and a bottom surface of the first field plate is greater than 90 degrees.

4. The high electron mobility transistor of claim 1, further comprising:

an etch stop layer, disposed on the second dielectric layer, wherein a bottom surface of the first field plate is in contact with the etch stop layer.

5. The high electron mobility transistor of claim 4, wherein the first via further passes through the etch stop layer and the second dielectric layer.

6. The high electron mobility transistor of claim 4, further comprising:

a second via, passing through the first dielectric layer, the etch stop layer and the second dielectric layer, and extended downward onto the source electrode;

a first wire, disposed on the first dielectric layer and in contact with the second via;

a third via, passing through the first dielectric layer, the etch stop layer and the second dielectric layer, and extended downward onto the drain electrode; and a second wire, disposed on the first dielectric layer and in contact with the third via.

7. The high electron mobility transistor of claim 6, wherein the second via, the third via, the first wire, the second wire, the first via, the gate electrode, the first field plate and the second field plate are all constructed of a first metal layer.

8. The high electron mobility transistor of claim 1, wherein the first field plate and the third field plate partially overlap in a vertical projection direction, and the first field plate has a step in height.

9. The high electron mobility transistor of claim 1, further comprising a third dielectric layer disposed on the semiconductor barrier layer, wherein both a portion of the source electrode and a portion of the drain electrode are extended onto a top surface of the third dielectric layer.

10. The high electron mobility transistor of claim 1, further comprising:

a dielectric segment, located between and laterally separated from the semiconductor cap layer and the drain electrode;

a third field plate, abutting a side of the dielectric segment; and a fourth field plate, disposed on a top surface of the dielectric segment, wherein the third field plate and the fourth field plate are connected to each other and extended continuously from the side of the dielectric segment onto the top surface of the dielectric segment.

11. The high electron mobility transistor of claim 10, wherein the source electrode, the drain electrode, the third field plate and the fourth field plate are all constructed of a second metal layer.

12. The high electron mobility transistor of claim 10, wherein the first field plate, the fourth field plate and the dielectric segment all partially overlap in a vertical projection direction, and the first field plate has two steps in height.

* * * * *